United States Patent [19]

Kim

[11] Patent Number: 4,994,143

[45] Date of Patent: Feb. 19, 1991

[54] METHOD FOR MANUFACTURING A BURIED HETEROSTRUCTURE LASER DIODE

[75] Inventor: Sang B. Kim, Daejon, Rep. of Korea

[73] Assignees: Electronics and Telecommunications Research Institute, Daejeon; Korea Telecommunication Authority, Seoul, both of Rep. of Korea

[21] Appl. No.: 503,222

[22] Filed: Apr. 2, 1990

[30] Foreign Application Priority Data

Apr. 6, 1989 [KR] Rep. of Korea .......................... 4512

[51] Int. Cl.[5] ...................... H01L 21/306; B44C 1/22; C03C 15/00; C03C 25/06
[52] U.S. Cl. ................................... 156/649; 156/653; 156/655; 156/657; 156/659.1; 156/662; 437/129; 437/133
[58] Field of Search ............... 156/649, 653, 655, 657, 156/659.1, 662; 437/104, 126, 129, 130, 133; 357/16, 17, 30; 372/43, 50

[56] References Cited

U.S. PATENT DOCUMENTS

| | | |
|---|---|---|
| 4,648,940 | 3/1987 | Menigaux et al. ................. 156/649 |
| 4,662,988 | 5/1987 | Renner ............................ 156/649 X |
| 4,692,206 | 9/1987 | Kaneiwa et al. ..................... 156/649 |
| 4,784,722 | 11/1988 | Liau et al. ............................ 156/649 |

*Primary Examiner*—William A. Powell
*Attorney, Agent, or Firm*—Blakely, Sokoloff, Taylor & Zafman

[57] ABSTRACT

A method for manufacturing a buried heterostructure laser diode comprising an active layer and a clad layer which are formed as a reverse mesa on a substrate, current blocking layers and an insulation layer deposited on the top of the blocking layers, and an electrode formed on the top thereof comprising: a first step for forming a SiO$_2$ stripe mask on the clad layer after a first liquid phase epitaxial growth of the active layer and the clad layer on the substrate, a second step for etching the clad layer under the SiO$_2$ stripe mask using an etchant to form a reverse mesa structure, a third step for selectively etching the clad layer using an etchant such as a family of hydrochloric acid and then for making the active layer protrude, and a fourth step for naturally melthig back the protruded porting of the active layer surface during the second epitaxial growth process is provided.

8 Claims, 3 Drawing Sheets

PROTRUDED PORTION

PROTRUDED PORTION

METHOD FOR MANUFACTURING A BURIED HETEROSTRUCTURE LASER DIODE

BACKGROUND OF THE INVENTION

This invention relates to a method for manufacturing a buried heterostructure laser diode.

A laser diode which is generally used as a source for optical communications is a buried heterostructure laser diode. The laser diode has mesa interfaces which are (111) In planes between an active region formed during a first epitaxial process and a current blocking layers formed during a second epitaxial growth process. Since the interfaces of the laser diode are exposed to a high temperature of about 600° C, crystal defects may be formed in the interfaces.

Since the damaged interfaces act as a nonradiative recombination center and a current leakage path, major performance indices such as production yield, life-time, stability, lasing threshold current of the diode was deteriorated.

In order to solve the above problems, a conventional approach in which the (111) In planes exposed to high temperatures are melted-back during a second liquid phase epitaxial growth process and then current blocking layers are grown on the clean surface made by the melt-back process was proposed.

By the above approach, buried heterostructure laser diodes having a long life-time and uniform low threshold current was made successfully. But, the above approach required complicated processing conditions and particular subsidary devices in slightly melting-back the damaged (111) In planes and had disadvantages as follows:

In InGaAsP lasers of 1.55μm lasing wavelength range, the InGaAsP surfaces damaged by heat are naturally melted-back during the second growth due to the large compositional difference, and any artificial melt-back process is not necessary. But since InGaAsP active layer with wavelength range of 1.3μm has a small difference in composition from the current blocking layers, and artificial melt-back process was required. Because the melt-back process was carried out using a unsaturated solution with ΔT of 0.2° C for a short time of 15 second close control of solution composition, melt-back time, and temperature were required and other particular devices were also required. It is thus inconvenient and complicated.

Accordingly, it is an object of this invention to provide a simple method for melting-back the damaged (111) In surface of the active layer the second liquid phase epitaxial growth process to solve the above problems.

SUMMARY OF THE INVENTION

The present invention may be summarized as a method for manufacturing a buried heterostructure laser diode comprising an active layer and a clad layer which are formed as a reverse mesa on a substrate, current blocking layers and an insulation layer deposited on the top of the blocking layers, and an electrode formed on the top thereof comprising: a first step for forming a SiO2 stripe mask on the clad layer after a first liquid phase epitaxial growth of the active layer and the clad layer on the substrate, a second step for etching the clad layer under the SiO2 stripe mask using an etchant to form a reverse mesa structure, a third step for selectively etching the clad layer using an etchant such as a family of hydrochloric acid and then for making the active layer protrude, and a fourth step for naturally melting back the protruded portion of the active layer surface during the second epitaxial growth process is provided.

It is another object of this invention to form the reverse mesa structure during an etching step instead of the two etching steps of the second and third steps using an etchant with low etching speed for etching the active layer.

BRIEF DESCRIPTION OF THE DRAWINGS

Other features of the present invention will be more readily understood from the following detailed description of specific embodiments thereof when read in conjunction with the accompanying drawings, in which:

FIG. 1 shows a cross sectional view of a reverse mesa InGaAsP/InP buried heterostructure laser diode, wherein 1 designates an electrode, 2 designates an insulation layer, 3 designates a n-InP layer, 4 designates a clad layer, 5 designates an (111) In plane, 6 designates a InP current blocking layer and 7 designates an InGaAsP active layer.

FIGS. 2A, 2B, 2C and 2D show each steps for forming a buried heterostructure laser diode with high reliability using the reverse mesa in which the active layer protrudes such than an defective active layer surface due to an exposure to high temperature may be naturally melted back without any artificial process during the second liquid phase epitaxial growth process of growing the current blocking layer 5. FIG. 2A shows a double heterostructure wafer on which deposited SiO2 etching mask is patterned by photolithography process. FIG. 2B shows a step for forming a reverse mesa. FIG. 2C shows a step for forming a partially protruded reverse mesa for the purpose of partial etching. FIG. 2D shows the reverse mesa structure with the damaged protruded portion of the active layer removed by the natural melting back without artificial operation during the second liquid phase epitaxial growth.

FIG. 2A, 4 designates a p-InP clad layer, 7 designates an InGaAsP active layer, 8 designates a SiO2 stripe mask and 9 designates a n+-InP buffer layer/n+-InP substrate.

Figure 2C:
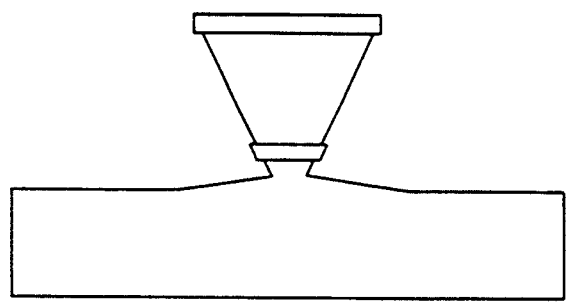
FIGS. 2A, 2B, 2C and 2D show each steps for forming the buried heterostructure laser diode.
Figure 2D:
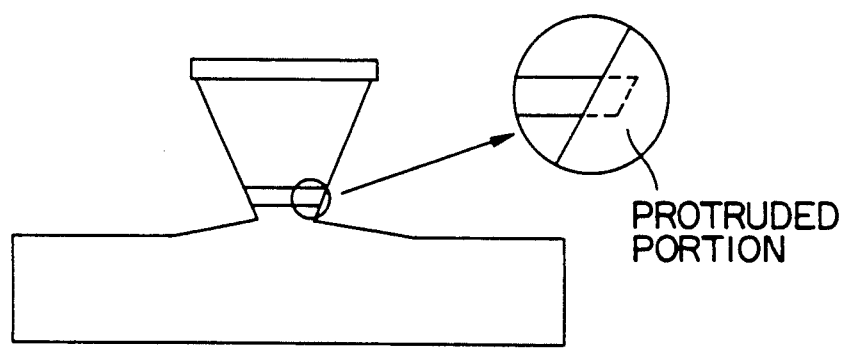
Figure 2A:
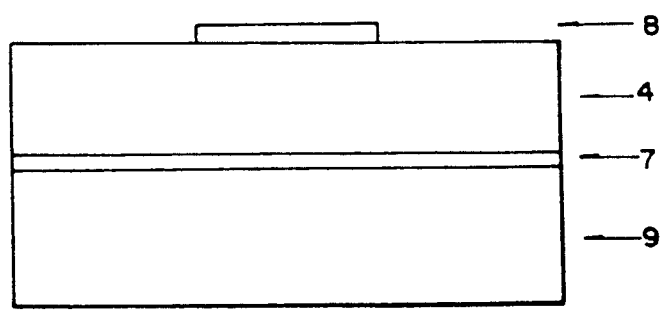

In the first step as shown in FIG. 2A, a double heterostructure consisted of n+-InP buffer layer/n+-InP substrate 9, an InGaAsP active layer 7 and a p-InP clad layer 4 are formed by the first liquid phase epitaxial growth and then SiO2 stripe make 8 is formed thereon.

Figure 2B:
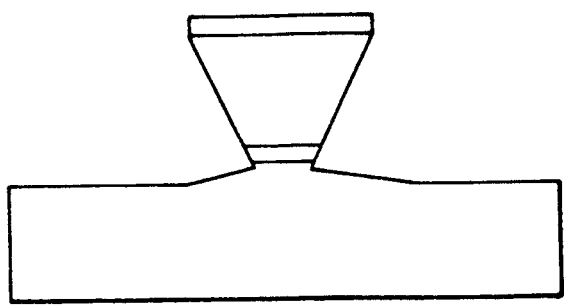

In the second step as shown in FIG. 2B, a reverse mesa is formed by etching the portion which was not protected by the SiO2 stripe mask 8 using the Br-Methanol solution.

In the third step as shown in FIG. 2C, a protruded reverse mesa in which the InGaAsP active layer 7 is remained unetched is formed using an etchant such as hydrochloric acid which etches selectively the InP layer [p-InP clad layer 4, n-InP buffer layer 9] only.

In the fourth step, the second epitaxial growth is proceeded for growing the current blocking layers 3 and 6. Since for the protruded portion, over-saturated solution is needed than in the case of plane portion in order to maintain equilibrium with the contacting solution which contacts the protruded portion (dashed line portion in FIG. 2D) of the reverse mesa formed in the third step during the second liquid phase epitaxial growth, only the protruded portion (dashed line portion in FIG. 2D) is melted out in the saturated or slightly oversaturated solution. As shown in FIG. 2D, the active layer surface damaged by the exposure to high temperature is removed and then the current blocking layers can be grown by the conventional method.

Figure 1:
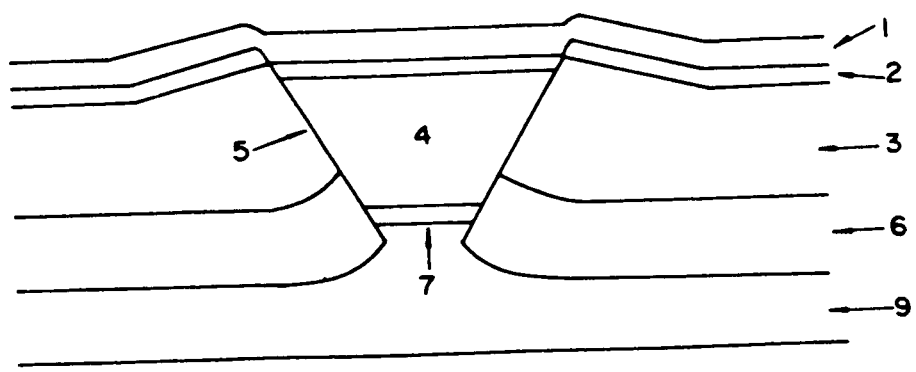
FIG. 1 shows a cross sectional view of a reverse mesa InGaAsP/InP double heterostructure buried heterostructure laser diode.

In the above steps, in order to melt back the protruded active layer surface (dashed line portion in FIG. 2D), either the method of assigning a hole of graphite boat for epitaxial growth to the solution for melting back or the method of carrying out the melting back of the protruded surface using a solution for growing the first current blocking layer (p-InP layer 6 in FIG. 1) concurrently with the first current blocking layer growth may be used.

A second embodiment of this invention will be described hereinafter. This embodiment comprises four steps of forming a SiO₂ stripe mask, forming a reverse mesa structure, selectively etching the reverse mesa structure to protrude InGaAsP active layer (7), and naturally removing the active layer surface with thermal damage (dashed line portion in FIG. 2D) during the second epitaxial growth to produce the laser diode with high reliability.

However, in the second embodiment, if a solution for etching the reverse mesa which has a higher etching speed of the clad layer (4 of FIG. 2B) and the intermediate layer (9 of FIG. 2C) than that of the active layer (7 of FIG. 2C) is used after the above described first step, the above described second step (FIG. 2B) and the third step (FIG. 2C) are carried out concurrently so as to reduce the four steps to three steps.

This invention is applicable to buried heterostructure semiconductor lasers formed of any kind of materials for growing the current blocking layers by liquid phase epitaxy method for example, III-V family compound semiconductor such as InGaAsP/InP family, GaAlAs/GaAs family, InGaAlAs/InP family et al, II-VI family compound semiconductor such as HgCdTe/CdTe, PbSnTe et al.

The advantages of this invention will be described hereinafter.

Since the characteristics of the interfaces between the active layer 7 and the current blocking layer 6 have a great effect on the performance of the buried heterostructure laser diode, and since the defected surface is removed by the melting back process, the current blocking layer 6 is then grown on the almost perfect surface, and therefore there is no crystal defects on the boundary surface, the buried heterostructure laser diode melting back process according to the method of this invention has numerous advantages when compared with the diodes without melting back process as follows:

a. leakage current and nonradiative current are reduced and lasing threshold current is reduced, and therefore the efficiency of the diode is higher;

b. production yield is higher; and c. operating characteristic is stable and the lifetime is longer.

The melting back method according to this invention has advantages compared with the artificial melting back method as follows:

a. there is no need of finely adjusting the solution compound for liquid phase epitaxial growth and also there is no need to design any particular graphite boat for accurately adjusting the composition of the solution;

b. there is no need to accurately adjust temperature during the melting back and concurrent liquid phase epitaxial growth and eventhough temperature is not accurately adjusted, the reverse mesa structure still remain; and c. there is no need to use complicated temperature program (temperature change on the time base in a programmed manner) during the second liquid phase epitaxial growth.

What is claimed is:

1. A method for manufacturing a buried heterostructure laser diode including a reverse mesa structure of an active layer (7) and a clad layer (4) formed on a substrate, current blocking layers (3) and (6) and an insulation layer (2) formed on the side of the mesa structure and an electrode (1) formed on the top of the mesa structure and an insulation layer, comprising:

a first step of forming a SiO₂ stripe mask (8) on the clad layer (4) after the first liquid-phase epitaxial growth of the active layer (7) and clad layer (4) on the substrate:

a second step of etching them under the SiO₂ stripe mask (8) using an echant for form reverse mesa structure;

a third step of selectively etching the clad layer (4) using an etchant of hydrochloric acid family to protrude the active layer (7); and a fourth step of naturally melting back the protruded portion of the active layer (7) during the second epitaxial growth for growing the current blocking layers.

2. The method of claim 1,
wherein the active layer (7) and the clad layer (4) are formed of one of the III-V family composition semiconductor group such as InGaAsP/InP family, GaAlAs/GaAs family and InGaAs/InP family.

3. The method of claim 1,
wherein the active layer (7) and the clad layer (4) are formed of one of the II-VI family composition semiconductor group such as HgCdTe/CdTe family and PbSnTe family.

4. The method of claim 1,
where in the fourth step, the protruded portion of the active layer (7) is melted back concurrently with the growth of the current blocking layers (3) and (6) using a solution for growing the first current blocking layer.

5. A method for manufacturing buried heterostructure laser diode including a reverse mesa structure of an active layer (7) and a clad layer (4) formed on a substrate, current blocking layers (3) and (6) and an insulation layer (2) formed on the side of the mesa structure and an electrode formed on the top of the mesa structure and the insulation layer, comprising:

a first step of forming a SiO₂ stripe mask (8) on the clad layer (4) after the growth of the active layer (7) and the clad layer (4) on the substrate;

a second step of protruding the active layer (7) using an etchant with higher etching speed of the clad layer (4) than that of the active layer (7) when the active layer (7) and the clad layer (4) are etched to be a reverse mesa structure;

a third step of naturally melting back the protruded portion of the active layer (7) during the second epitaxial growth for growing the current blocking layers.

6. The method of claim 5,
wherein the active layer (7) and the clad layer (4) are formed of one of the III-V family composition semiconductor group such as in GaAsP/InP family, GAAlAs/GaAs family and InGaAlAs/InP family.

7. The method of claim 5,
wherein the active layer (7) and the clad layer (4) are formed of one of the II-VI family composition semiconductor group such as HgCdTe/CdTe family and PbSnTe family.

8. The method of claim 5,
wherein in the fourth step, the protruded portion of the active layer (7) is melted back concurrently with the growth of the current blocking layers (3) and (6) using a solution for growing the first current blocking layer.

* * * * *

UNITED STATES PATENT AND TRADEMARK OFFICE
CERTIFICATE OF CORRECTION

PATENT NO.    :   4,994,143

DATED         :   February 19, 1991

INVENTOR(S)   :   Kim

It is certified that error appears in the above-identified patent and that said Letters Patent is hereby corrected as shown below:

| | | |
|---|---|---|
| col. 04, line 6 | delete "melting" | insert --melt-- |
| col. 04, line 27 | delete "for" | insert -- to-- |

Signed and Sealed this

Twenty-third Day of November, 1993

Attest:

BRUCE LEHMAN

Attesting Officer

Commissioner of Patents and Trademarks